United States Patent [19]

Takahashi et al.

[11] 4,338,576

[45] Jul. 6, 1982

[54] ULTRASONIC ATOMIZER UNIT UTILIZING SHIELDED AND GROUNDED ELEMENTS

[75] Inventors: Minoru Takahashi, Funabashi; Sadao Mitsui, Chiba, both of Japan

[73] Assignee: TDK Electronics Co., Ltd., Tokyo, Japan

[21] Appl. No.: 54,588

[22] Filed: Jul. 3, 1979

[30] Foreign Application Priority Data

Jul. 26, 1978 [JP] Japan .......................... 53-101891[U]
Sep. 8, 1978 [JP] Japan .......................... 53-122707[U]

[51] Int. Cl.³ .......................................... H03B 5/36
[52] U.S. Cl. .................................... 331/67; 310/317; 331/68; 331/116 R; 333/12
[58] Field of Search ...................... 366/113, 114, 116; 331/116 R, 67, 68, 177 R; 310/317; 333/12; 307/91

[56] References Cited

U.S. PATENT DOCUMENTS 1,994,905 3/1935 Bowles ................................ 333/12
2,296,678 9/1942 Linder .................................. 333/12
2,404,640 7/1946 Lawrance ............................ 331/67
3,278,862 10/1966 Danzer ............................ 331/116 R
3,528,032 9/1970 Tahmisian, Jr. et al. ....... 331/116 R
4,054,848 10/1977 Akita ................................ 331/116 R
4,152,671 5/1979 Tuma et al. .......................... 331/68

FOREIGN PATENT DOCUMENTS 994086 6/1965 United Kingdom ................. 331/67

*Primary Examiner*—Siegfried H. Grimm
*Assistant Examiner*—Edward P. Westin
*Attorney, Agent, or Firm*—Robert Scobey

[57] ABSTRACT

Noise potentials and radiation in an ultrasonic nebulizer are reduced by separating the oscillator and power supply and shielding the former, with one of the DC power lines to the oscillator passing through an aperture in the metal casing that shields the oscillator, while the other power supply line is connected to that casing. Oscillator control may be achieved by an unshielded variable resistor coupled by conductors of extended length to the oscillator by a filter circuit.

3 Claims, 5 Drawing Figures

ULTRASONIC ATOMIZER UNIT UTILIZING SHIELDED AND GROUNDED ELEMENTS

BACKGROUND AND BRIEF DESCRIPTION OF THE INVENTION

This invention relates to an ultrasonic atomizer unit. More particularly it relates to the energization of a piezo-electric vibrator in such a unit so as to reduce noise or undesired signals in the circuitry as well as radiated therefrom.

In general, in an ultrasonic liquid atomizer unit for atomizing water and the like by applying an ultrasonic wave thereto, it has been found to be difficult to reduce noise potentials and radiated signals in the ultrasonic liquid atomizer unit due to the relatively high frequencies and power involved, e.g., a driving input frequency of the piezo-electric vibrator of about 1 to 2 MHz or so and a power input of at least about 10 to 30 watts is required to produce atomization of about 400 to 500 cc per hour. Further, when using water, it is difficult to utilize a metal body in the outer casing.

In the past, a piezo-electric vibrator has been fixed to a chamber base to be attached to the bottom of the atomizer container of an ultrasonic liquid atomizer device. A base plate on which the driver circuit is assembled has been mounted to the chamber base, and an annular metal plate of copper or aluminum, e.g., having a wall thickness of about 0.2 to 0.8 mm, has been arranged with an insulator to surround the circumference of the base plate. Even though radiated noise may be decreased by the use of such a surrounding metal plate, noise signals passed through the power supply line are not effectively reduced.

It is also known to use a metal casing to cover both the piezo-electric vibrator (mounted on the chamber base of an ultrasonic atomizer unit) and the driver circuit that includes a power supply circuit. In such a system, a noise filter has also been arranged in the metal casing to restrict radiated noise and noise potentials. However, such arrangements are complicated and expensive, since a symmetrical noise filter is required in the power supply line ahead of the rectifier in the power supply circuit, and the noise filter should be shielded to prevent the radiated noise from being fed to the input terminal of the noise filter in the metal casing.

The present invention provides an ultrasonic atomizer unit in which the above described disadvantages are eliminated, and both noise potentials and radiated noise are decreased by a simple construction or arrangement.

In a presently preferred embodiment of the present invention, the driving circuit for energizing the piezo-electric vibrator is separated into a power supply part and an oscillator part, and shielding the latter by a metal housing. One of the power supply lines to the oscillator extends through an aperture in the housing, while the other power supply line is connected to the metal housing. A passing capacitor is preferably included in the aperture.

The invention also contemplates use of a filter in such an oscillator circuit, together with an adjustment resistor for controlling the oscillator mounted unshielded outside the metal housing.

The invention will be more completely understood by reference to the following detailed description.

DETAILED DESCRIPTION

Figure 1:
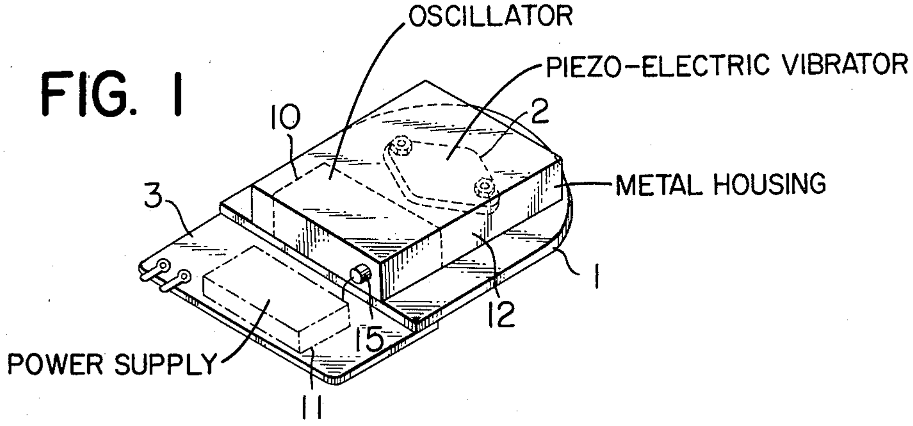
FIG. 1 is a perspective view of an ultrasonic atomizer unit embodying the invention.
Figure 2:
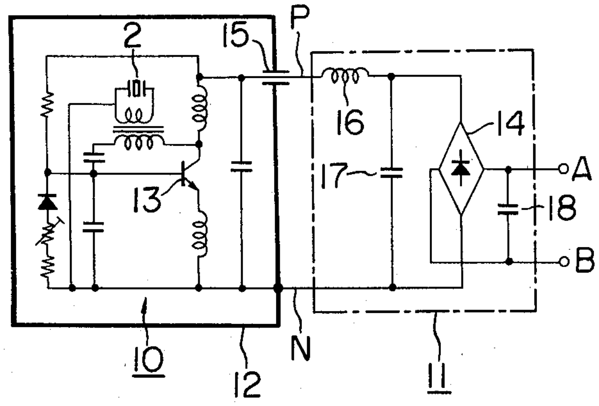
FIG. 2 is a circuit diagram of the power supply and oscillator parts of the unit of FIG. 1.

Referring now to FIGS. 1 and 2, the driver circuit for energizing a piezo-electric vibrator 2 mounted on a chamber base 1 is separated into an oscillator 10 and a power supply 11 mounted on a base plate 3. The oscillator 10 is covered and shielded by a metal housing 12 of copper or aluminum, e.g., which is arranged on the chamber base 1. The oscillator 10 may be a conventional transistor oscillator circuit as shown in FIG. 2, including a transistor 13 and other components as shown. Negative power supply line N supplies DC voltage to the oscillator from the negative DC output terminal of a rectifier 14 in power supply 11 assembled on the base plate 3. This negative power supply line is connected to the metal housing 12. Positive power supply line P extends out of the metal housing 12 via a passing capacitor or insulating sleeve 15 mounted in an aperture in the metal housing 12. The positive power supply line P is connected to the positive DC output terminal of the rectifier 14 via inductor 16. A capacitor 17 is connected between the DC output terminals of the rectifier 14, while a capacitor 18 is connected between AC input terminals A and B.

In the arrangement described above, noise radiated by the oscillator 10 is shielded by the metal housing 12 and significantly decreased. The noise voltage transmitted in the positive power supply line P is sufficiently removed by a noise filter constituted by the passing capacitor 15, inductor 16, and capacitor 17. Capacitor 18 aids in removing noise potentials at AC input terminals A and B.

Figure 3:
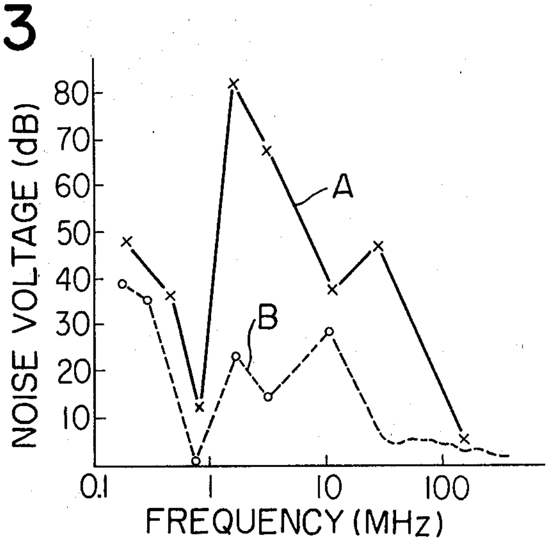
FIG. 3 are noise potential curves showing the advantages of the invention.

FIG. 3 illustrates the effect of the present invention in decreasing noise. Curve A shows the relationship between noise potential and frequency in a circuit of the type found in the prior art, while curve B illustrates the relationship in a circuit of the type of FIG. 2. Comparing these two curves, it is obvious that noise is significantly decreased by the present invention.

The following effects are apparent:

(1) Separating the driver circuit into the oscillator 10 and the power supply 11, shielding the oscillator 10 by the metal housing 12, and extending the power supply line from the metal housing 12 through the passing capacitor 15 significantly decreases radiated noise.

(2) Arranging the noise filter in the power supply line between the oscillator 10 and the rectifier 14 causes the number of parts to be decreased and lowers cost as compared with including a noise filter at the AC input.

(3) Since radiated noise is not apt to be fed to the noise filter, less shielding of the inductor 16 and the capacitors 17 and 18 is required, thereby simplifying the structure.

(4) In addition to the above, it should be noted that a number of small sized apertures (not shown) may be made in the metal housing 12 in order to radiate the heat generated.

In many cases it is desired to vary oscillator output in an ultrasonic liquid atomizer. The control for varying the output should be located on the outside of the atomizer assembly, for easy access, using conductors of extended length, as necessary.

Figure 4:
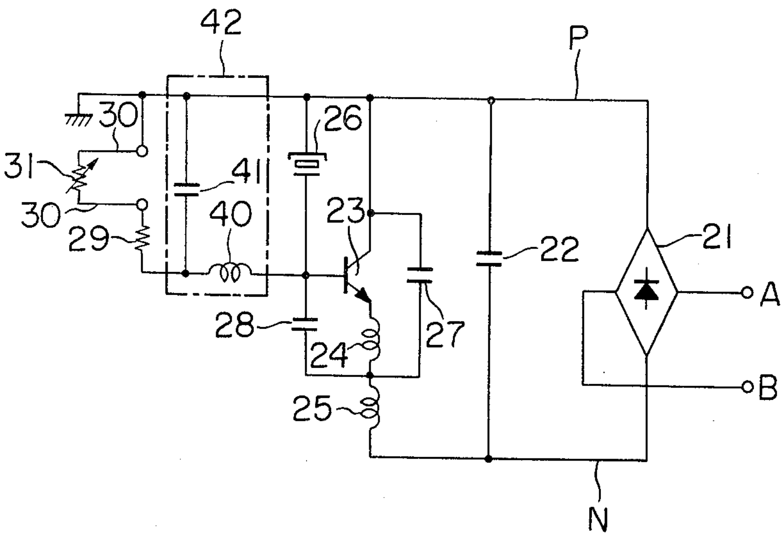
FIG. 4 is a circuit diagram of an alternative power supply and oscillator useful in practicing the invention.

FIG. 4 illustrates one example of a circuit in which the above described circuit components are provided, including a driver circuit having a Colpitts self-oscillator of which the collector of the transistor therein is grounded.

In this circuit, AC voltage to be applied between the power supply terminals A and B is rectified by a rectifier 21, smoothed by a smoothing capacitor 22 and fed to a positive line P and a negative line N as a DC voltage. The collector of transistor 23 is directly connected to the positive line P, and the emitter is connected to the negative line N via windings 24 and 25. Between the collector and the base of the transistor 23 is connected a piezo-electric vibrator 26 for generating an ultrasonic wave. Thus, a terminal at the ultrasonic radiation side of the piezo-electric vibrator 26 is connected to the positive line P, and that positive line P is grounded. Between the collector of the transistor 23 and a junction point of the winding 24 and 25 is connected a capacitor 27, and between the transistor base and the same junction point of the windings 24 and 25 is connected a capacitor 28. Further, a biasing current is fed to the base of the transistor 23 via a biasing resistor 29 and a variable resistor 31 connected to the bias resistor in series by an extended line 30.

In such a circuit, the capacitor 27 and the winding 25 form a parallel resonant circuit, which has an equivalent value, the winding 24 is a complementary coil for forming the wave shape, and the capacitor 22 operates to decrease the high frequency impedance between the positive line P and the negative line N. This Colpitts oscillation circuit oscillates to generate an output of several 10 watts or so under such conditions as the parallel resonant circuit is capacitive and the piezo-electric vibrator 26 is inductive.

In such a circuit, it is possible to connect the collector of the transistor 23 to ground, so that radiation of noise from the collector side is prevented. Noise radiated from the extended line 30 connected to the base of the transistor normally would lead to some problems. That is, it is customery that the variable resistor 31 for varying oscillator output is arranged in a casing or similar structure of the ultrasonic liquid atomizer, permitting convenient and efficient oscillator adjustment. In such an arrangement, the extended line 30 is often elongated, and a high frequency current flowing in the extended line leads to an undesired radiated signal.

To overcome this problem, the present invention involves the insertion of a filter circuit in the base biasing circuit of the oscillation transistor. In FIG. 4, filter circuit 42 having a winding 40 and a capacitor 41 is inserted into the base biasing circuit of the oscillation transistor 23. Both a biasing resistor 29 and the variable resistor 31 are connected in series with the extended line 30 between the collector and the base of the transistor 23.

In this circuit, a sufficiently high impedance (compared with the driving impedance of the piezo-electric vibrator 26) of high frequency is provided in the base biasing circuit by insertion of the filter circuit 42. A substantially decreased high frequency current flows in the base biasing circuit. Thus, it is possible to decrease the radiated noise from the extended line 30, which permits further extending of the extended line 30. Since high frequency may be decreased by the biasing resistor 29 when the variable resistor 31 is provided in the positive line P, it would be further expected that the effect of the winding 40 and the capacitor 41 in the filter circuit 42 could be enlarged.

Figure 5:
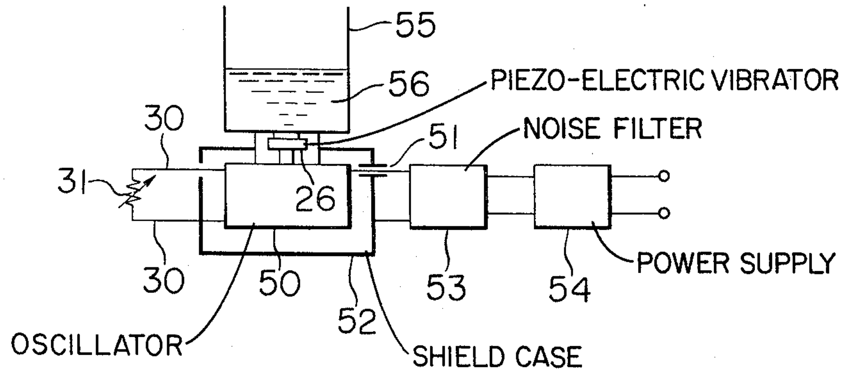
FIG. 5 is a block diagram of an ultrosonic atomizer unit embodying the invention and utilizing the circuit of FIG. 4.

FIG. 5 illustrates an ultrasonic atomizer unit incorporating the features of FIGS. 1 and 4. Oscillator 50 is a collector grounded Colpitts self-oscillation circuit provided with the filter circuit 42 of FIG. 4. A power supply line in the oscillator 50 extends through passing capacitor 51 positioned in an aperture in shield case 52 and is connected to power supply circuit 54 via power supply noise filter 53. The piezo-electric vibrator 26 is installed in the bottom of container 55, and an end of the ultrasonic wave radiation surface contacts liquid 56 in the container 55. The variable resistor 31 is connected to the oscillator 50 by the extended line 30.

In the circuit of FIG. 5, it is possible to eliminate not only noise radiated from the extended line 30 but also some noise found at the power supply line. It has been found that the field intensity of radiation when a shield and a power supply noise filter as in FIG. 5 are employed is about 55 dB (0 db$=1\mu$ V/m), when the capacitor 41 in the filter circuit 42 is set to 10,000 PF and the winding 40 is set to 100 $\mu$H. Extremely efficient results are obtained through the use of the filter circuit 42 in the base biasing circuit.

From the description above, it is apparent that oscillator shielding and transistor base biasing circuit filtering substantially reduce noise potentials and radiation. The above described preferred embodiments are obviously subject to modifications. Thus the invention should be taken to be defined by the following claims.

What is claimed is:

1. In an ultrasonic atomizer unit including a chamber base, a piezo-electric vibrator attached to the chamber base, and a driving circuit for energizing the piezo-electric vibrator, the improvement wherein said driving circuit is separated into an oscillator part and a power supply part having a rectifier, said oscillator part is shielded by a metal housing, one of the power supply lines to said oscillator part extends through an aperture in said metal housing and is coupled to said rectifier, and another power supply line to said oscillator part is connected to said metal housing and also is coupled to said rectifier, there is provided a variable circuit element for controlling the output signal from said oscillator part, said variable circuit element is positioned outside said metal housing, a filter circuit is inserted between said oscillator part and said variable circuit element, said oscillator part comprises a self-driving oscillator circuit, said variable circuit element is a variable resistor, said variable resistor and said filter circuit are arranged in an electrode biasing circuit of said oscillator circuit, said oscillator circuit includes a transistor having a grounded collector, and said variable resistor is coupled to the base of said transistor by said filter circuit.

2. An ultrasonic atomizer unit as set forth in claim 1, wherein said one power supply line is connected to a DC output terminal of said rectifier via an inductor, said another power supply line is connected to another DC output terminal of said rectifier, and said DC output terminals of said rectifier are coupled together by a capacitor.

3. An ultrasonic atomizer unit as set forth in claim 1 or 2, wherein, for reducing noise potentials and radiation, said metal housing that shields said oscillator part constitutes electrical ground, and said another power supply line to said oscillator part is grounded by being directly connected to said metal housing.

* * * * *